US007211902B2

(12) United States Patent
Yamaha

(10) Patent No.: US 7,211,902 B2
(45) Date of Patent: May 1, 2007

(54) METHOD OF FORMING A BONDING PAD STRUCTURE

(75) Inventor: Takahisa Yamaha, Shizuoka (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/354,134

(22) Filed: Feb. 15, 2006

(65) Prior Publication Data

US 2006/0138662 A1 Jun. 29, 2006

Related U.S. Application Data

(62) Division of application No. 11/073,753, filed on Mar. 8, 2005, now Pat. No. 7,067,928, which is a division of application No. 09/866,421, filed on May 25, 2001, now Pat. No. 6,921,714, which is a division of application No. 09/407,910, filed on Sep. 29, 1999, now Pat. No. 6,297,563.

(30) Foreign Application Priority Data

Oct. 1, 1998 (JP) ................................ 10-294459

(51) Int. Cl.
*H01L 23/48* (2006.01)
*H01L 23/42* (2006.01)
*H01L 29/40* (2006.01)

(52) U.S. Cl. ...................... 257/780; 257/782; 257/784; 257/786; 257/E23.01; 257/E23.02; 257/E23.021; 257/E23.023

(58) Field of Classification Search ..................... None
See application file for complete search history.

(56) References Cited

U.S. PATENT DOCUMENTS 5,149,674 A 9/1992 Freeman, Jr. et al.

(Continued)

FOREIGN PATENT DOCUMENTS

JP 61-59855 3/1986

(Continued)

*Primary Examiner*—Jasmine Clark
(74) *Attorney, Agent, or Firm*—Dickstein, Shapiro, LLP.

(57) ABSTRACT

A semiconductor device having a semiconductor substrate and a bonding pad portion formed on the semiconductor substrate, the bonding pad portion having: an insulating film formed on the semiconductor substrate and a first-level conductive pad layer of a large island shape formed on the insulating film; first-level to (n−1)-level (n is an integer of 3 or larger) interlayer insulating films formed on and over the insulating film; second-level to n-level conductive pad layers formed on the interlayer insulating films in areas generally corresponding to an area where the first conductive pad layer was formed; a plurality of small diameter first through holes from the first-level to (n−1) level formed through the first-level to (n−1) level interlayer insulating films in areas generally corresponding to an area where the first conductive pad layer; a plurality of first contact plugs filled in the small diameter first through holes from the first-level to (n−1)-level, the first contact plugs at each level being conductive and electrically connecting two conductive pad layers adjacent along a normal to a surface of the semiconductor substrate, among the first-level to n-level conductive pad layers disposed in and on the first-level to (n−1)-level interlayer insulating films; an n-level interlayer insulating film formed on the (n−1)-level interlayer insulating film and covering the n-level conductive pad; a large diameter through hole formed though the n-level interlayer insulating film in an area corresponding to an area where the n-level conductive pad was formed; the large diameter through hole having a size corresponding to the n-level conductive pad to expose a substantial upper surface of the n-level conductive pad; and a bonding pad formed on the n-level interlayer insulating film and n-level conductive pad via the large diameter through hole.

14 Claims, 7 Drawing Sheets

U.S. PATENT DOCUMENTS 5,248,903 A 9/1993 Heim
5,291,062 A 3/1994 Higgins, III
5,345,108 A 9/1994 Kikkawa
5,475,236 A 12/1995 Yoshizaki
5,502,337 A 3/1996 Nozaki
5,525,546 A 6/1996 Harda et al. ................ 438/622
5,736,791 A 4/1998 Fujiki et al. ................ 257/781
5,739,587 A 4/1998 Sato
5,838,023 A 11/1998 Goel et al. .................... 257/48
5,847,466 A 12/1998 Ito et al. ..................... 257/775
5,923,088 A 7/1999 Shine et al. ................ 257/758
5,939,789 A 8/1999 Kawai et al. ............... 257/758
6,031,293 A 2/2000 Hsuan et al. ............... 257/786
6,037,668 A 3/2000 Cave et al. ................. 257/784
6,133,625 A 10/2000 Maeda ....................... 257/678
6,265,313 B1 7/2001 Huang et al. ............... 438/687

FOREIGN PATENT DOCUMENTS

JP 6-283611 10/1994
JP 6-326150 11/1994
JP 7-335690 12/1995
JP 9-219451 8/1997

A
B
34
34B
28B
32b
30b
24b
22B
16B
18b
32a
28A
22A
16A
(70, 72)
28
26b
22
20b
16
14b
12
10
30a
26a
24a
20a
18a
14a

METHOD OF FORMING A BONDING PAD STRUCTURE

CROSS REFERENCE TO RELATED APPLICATIONS

This application is a Divisional of Application Ser. No. 11/073,753, filed Mar. 8, 2005, now U.S. Pat. No. 7,067,928 which is a Divisional of Application Ser. No. 09/866,421, filed May 25, 2001, now U.S. Pat. No. 6,921,714 which is a Divisional of Application Ser. No. 09/407,910, filed Sep. 29, 1999, and issued as U.S. Pat. No. 6,297,563 on Oct. 2, 2001, the entire disclosures of each of which are incorporated herein by reference.

This application is based on Japanese patent application No. HEI 10-294459 filed on Oct. 1, 1998, the entire contents of which are incorporated herein by reference.

BACKGROUND OF THE INVENTION a) Field of the Invention

The present invention relates to a bonding pad structure of a semiconductor device such as an LSI, and more particularly to a bonding pad structure having n (n is an integer of 3 or larger) pad layers and (n−1) interlayer insulating films.

b) Description of the Related Art

A most common bonding pad structure has large bonding pads formed on the highest-level insulating film among a plurality of insulating films. With such a bonding pad lamination structure, if a lamination film including a coated insulating film such as organic or inorganic SOG (spin on glass) is used as the insulating film or films under the pad layer, peel-off or cracks of the coated insulating film may occur because of heat and pressure during the bonding, thereby lowering the reliability.

In order to solve this problem, semiconductor devices having a bonding pad area such as shown in FIGS. 8 to 11 are known (refer to JP-A-9-219451).

In the semiconductor device shown in FIG. 8, a first-level (first-layer) insulating film 2 is formed on the surface of a semiconductor substrate 1. On this first-level insulating film 2, a plurality of first-level wiring layers 3*a* and a plurality of first-level pad layers 3*b* are formed. The wiring layer 3*a* is formed in an inner wiring area A including an integrated circuit formed on the semiconductor substrate 1. The pad layer 3*b* is formed in a bonding pad area B disposed around the inner wiring area A.

On the first-level insulating film 2, a first-level interlayer insulating film 4 is formed covering the plurality of wiring layers 3*a* and pad layers 3*b*. The upper surface of the first-level interlayer insulating film 4 is planarized by chemical mechanical polishing (CMP). A contact hole 4A and a plurality of contact holes 4B are formed through the first-level interlayer insulating film 4 by photolithography and dry etching in the areas corresponding to the wiring layer 3*a* and pad layer 3*b*. First-level contact plugs 5*a* and 5*b* are filled in the contact holes 4A and 4B. These contact plugs 5*a* and 5*b* are formed by forming a conductive layer of tungsten (W) or the like on the insulating film 4 and in the contact holes 4A and 4B, and thereafter etching back the conductive layer until the upper surface of the insulating film 4 is exposed.

On the first-level interlayer insulating film 4, a second-level wiring layer 6*a* and a second-level pad layer 6*b* are formed. The wiring layer 6*a* is connected via the contact plug 5*a* to the wiring layer 3*a*, and the pad layer 6*b* is connected via a plurality of contact plugs 5*b* to the pad layer 3*b*.

On the first-level interlayer insulating film 4, a second-level interlayer insulating film 7 is formed covering the second-level wiring layer 6*a* and second-level pad layer 6*b*. The upper surface of the second-level interlayer insulating film 7 is planarized by CMP. A contact hole 7A and a plurality of contact holes 7B are formed through the second-level interlayer insulating film 7 by photolithography and dry etching in the areas corresponding to the second-level wiring layer 6*a* and second-level pad layer 6*b*. Second-level contact plugs 8*a* and 8*b* are filled in the contact holes 7A and 7B. These contact plugs 8*a* and 8*b* are formed by a process similar to that of forming the first-level contact plugs 5*a* and 5*b* described above.

On the second-level interlayer insulating film 7, a third-level wiring layer 9*a* and a third-level pad layer 9*b* are formed. The third-level wiring layer 9*a* is connected via the second-level contact plug 8*a* to the second-level wiring layer 6*a*, and the third-level pad layer 9*b* is connected via a plurality of second-level contact plugs 8*b* to the second-level pad layer 6*b*.

In the semiconductor device shown in FIG. 9, the wring structure in the inner wiring area A is similar to that in the inner wiring area A shown in FIG. 8. In FIG. 9, like elements to those shown in FIG. 8 are represented by using identical reference symbols, and the description thereof is omitted.

In the bonding pad area B shown in FIG. 9, the insulating film 4 is formed on the insulating film 2, and the insulating film 7 is formed on the insulating film 4. On the insulating film 7, a pad layer 9*b* is formed by using the same process as that of forming the wiring layer 9*a*.

In the semiconductor device shown in FIG. 10, the wring structure in the inner wiring area A is similar to that in the inner wiring area A shown in FIG. 8. In FIG. 10, like elements to those shown in FIG. 8 are represented by using identical reference symbols, and the description thereof is omitted.

In the bonding pad area B shown in FIG. 10, the insulating film 4 is formed on the insulating film 2, and on the insulating film 4 the pad layer 6*b* is formed by using the same process as that of forming the wiring layer 6*a*.

On the insulating film 4, the insulating film 7 is formed covering the wiring layer 6*a* and pad layer 6*b*. The upper surface of the insulating film 7 is planarized by CMP. Contact holes 7A and 7B are formed through the insulating film 7 by photolithography and dry etching in the areas corresponding to the wiring layer 6*a* and layer 6*b*. The contact hole 7S is made larger in size than the contact hole 7A for the later process of bonding a bonding wire.

After a conductive layer of W or the like is formed on the insulating film 7 and in the contact holes 7A and 7S, the conductive layer is etched back until the upper surface of the insulating film is exposed. A contact plug 8*a* made of conductive material such as W is therefore formed in the contact hole 7A. At this time, although a thin conductive layer (not shown) is left on the side wall of the contact hole 7S, most of the conductive layer are etched and removed during the etch-back process so that the upper surface of the pad layer 6*b* is exposed in the contact hole 7S.

A wiring layer is deposited on the insulating film 7, covering the contact plug 8*a* and the contact hole 7S, and patterned to form a wiring layer 9*a* and a pad layer 9*b*. The pad layer 9*b* directly contacts the pad layer 6*b* in the contact hole 7S.

In the semiconductor device shown in FIG. 11, on the insulating film 2 covering the surface of the substrate 1, the first-level wiring layer 3*a* and the first-level pad layer 3*b* are formed by the method similar to that described with reference to FIG. 8. On the insulating film 2, the insulating film 4 is formed covering the wiring layer 3*a* and pad layer 3*b*. The upper surface of the insulating film 4 is planarized by CMP.

Similar to the contact holes 7A and 7S described with reference to FIG. 10, a small size contact hole 4A and a large size contact hole 4S are formed through the insulating film 4 in the areas corresponding to the wiring layer 3*a* and pad layer 3*b*. Similar to the contact plug 8*a* described with reference to FIG. 10, a contact plug 5*a* made of conductive material such as W is formed in the contact hole 4A. Similar to the wiring layer 9*a* and pad layer 9*b* described with reference to FIG. 10, a second-level wiring layer 6*a* and a second-level pad layer 6*b* are formed on the insulating film 4. The wiring layer 6*a* is connected via the contact plug 5*a* to the wiring layer 3*a*, and the pad layer 6*b* is directly connected to the pad layer 3*b* in the contact hole 4S.

On the insulating film 4, an insulating film 7 is formed covering the wiring layer 6*a* and pad layer 6*b*. The upper surface of the insulating film 7 is planarized by CMP. A small size contact hole 7A corresponding to the wiring layer 6*a* and a large size contact hole 7S corresponding to the pad layer 6*b* are formed through the insulating layer 7 by photolithography and dry etching.

In the semiconductor device shown in FIG. 11, a depth a of the contact hole 7A is smaller than a depth b of the contact hole 7S. During the selective dry etching of forming the contact holes 7A and 7S, it is necessary to over-etch the contact hole 7A to the depth b after the depth a of the contact hole 7S is obtained. Therefore, the size of the contact hole 7A becomes larger than the design value.

In the semiconductor device shown in FIG. 8, the first-level contact holes 4A and 4B have substantially the same depth, and the second-level contact holes 7A and 7B also have substantially the same depth. In the semiconductor device shown in FIG. 9, no contact hole is formed in the bonding pad area. In the semiconductor device shown in FIG. 10, the contact holes 7A and 7S have substantially the same depth.

In the bonding pad structure shown in FIG. 8, a single bonding pad layer 9*b* is bonded with a bonding wire. It is therefore not easy to have a sufficient bonding pad strength. For example, if an Au wire is bonded to the pad layer 9*b* made of Al alloy, a lowered shearing stress is sometimes found by a shear test after the pad layer is exposed to a high temperature. The reason for this may be ascribed to a thin pad layer 9*b* and an insufficient supply of Al to the bonded portion (the details of which are to be referred to JP-A-7-335690).

In the bonding pad structures shown in FIGS. 9 and 10, if a lamination film including a coated insulating film such as organic or inorganic SOG (spin on glass) is used as the insulating films 4 and 7 or the insulating film 4 under the pad layer 9*b*, peel-off or cracks of the coated insulating film may occur because of heat and pressure during the bonding, thereby lowering the reliability.

SUMMARY OF THE INVENTION

It is an object of the present invention to provide a novel bonding pad structure of a semiconductor device capable of improving a bonding pad strength by preventing peel-off and cracks of an insulating film, especially of coated insulating film to be caused by heat and pressure during the bonding and preventing a lowered reliability.

It is another object of the present invention to provide a novel bonding pad structure of a semiconductor device capable of preventing peel-off and cracks of a coated insulating film included in a lamination film to be used as an interlayer insulating film.

According to one aspect of the present invention, there is provided a semiconductor device comprising: a semiconductor substrate; and a bonding pad portion formed on the semiconductor substrate, the bonding pad portion comprising: an insulating film formed on the semiconductor substrate and a first-level conductive pad layer of a large island shape formed on the insulating film; first-level to (n−1)-level (n is an integer of 3 or larger) interlayer insulating films formed on and over the insulating film; second-level to n-level conductive pad layers formed on the interlayer insulating films in areas generally corresponding to an area where the first conductive pad layer was formed; a plurality of small diameter first through holes from the first-level to (n−1) level formed through the first-level to (n−1) level interlayer insulating films in areas generally corresponding to an area where the first conductive pad layer; a plurality of first contact plugs filled in the small diameter first through holes from the first-level to (n−1)-level, the first contact plugs at each level being conductive and electrically connecting two conductive pad layers adjacent along a normal to a surface of the semiconductor substrate, among the first-level to n-level conductive pad layers disposed in and on the first-level to (n−1)-level interlayer insulating films; an n-level interlayer insulating film formed on the (n−1)-level interlayer insulating film and covering the n-level conductive pad; a large diameter through hole formed through the n-level interlayer insulating film in an area corresponding to an area where the n-level conductive pad was formed, the large diameter through hole having a size corresponding to the n-level conductive pad to expose a substantial upper surface of the n-level conductive pad; and a bonding pad formed on the n-level interlayer insulating film and n-level conductive pad via the large diameter through hole.

According to another aspect of the present invention, there is provided a method of manufacturing a semiconductor device, comprising the steps of: (a) forming an insulating film on a semiconductor substrate; (b) forming a first conductive pad layer of a large island shape on the insulating film; (c) forming a first interlayer insulating film on the insulating film, the first interlayer insulating film covering the first conductive pad layer; (d) forming a second conductive pad layer on the first interlayer insulating film in an area corresponding to the first conductive pad layer; (e) forming a small diameter first through hole through the first interlayer insulating film in an area corresponding to an area where the first conductive pad layer was formed; (f) filling a conductive first contact plug in the small diameter first contact hole to electrically connecting the first and second conductive pad layers; (g) sequentially repeating the steps (c) to (f) to form second-level to n-level (n is an integer of 3 or larger) conductive pad layers and second-level to (n−1)-level interlayer insulating films and electrically connect two conductive pad layers adjacent along a normal to a surface of the semiconductor substrate; (h) forming an n-level interlayer insulating film on the (n−1)-level interlayer insulating film; (i) forming a large diameter through hole through the n-level interlayer insulating film, the large diameter through hole having generally a same size as the n-level conductive pad layer; and (j) forming a bonding pad on the n-level interlayer insulating film, the bonding pad being electrically connected to the n-level conductive pad layer via the large diameter through hole.

A bonding stress applied to an interlayer insulating film when a wire is bonded to the bonding pad is distributed to a plurality of contact plugs. It is therefore possible to suppress peel-off and cracks of the interlayer insulating film (coated insulating film) and a high reliability semiconductor device can be realized.

Since the n-level (highest level) pad layer is directly contacted to the (n−1)-level pad layer under the highest level pad layer in the contact hole formed through the (n−1)-level interlayer insulating film under the highest level interlayer insulating film. It is therefore possible to obtain a bonding pad strength sufficient for bonding a wire to the highest level (n-level) pad layer.

Furthermore, the upper surface of each interlayer insulating film at the lower-level than the (n−1)-level under the highest level insulating film is planarized, and the n-level (highest level) pad layer is directly contacted to the (n−1)-level pad layer under the highest level pad layer in the contact hole formed through the (n−1)-level interlayer insulating film under the highest level interlayer insulating film. Accordingly, the depths of the contact holes in each interlayer insulating film can be made substantially the same both in the bonding pad area and inner wiring area. It is possible to prevent an undesired increase in the size of the contact hole to be caused by an over-etch during the etching process of forming the contact hole.

DETAILED DESCRIPTION OF THE PREFERRED EMBODIMENTS

Figure 1:
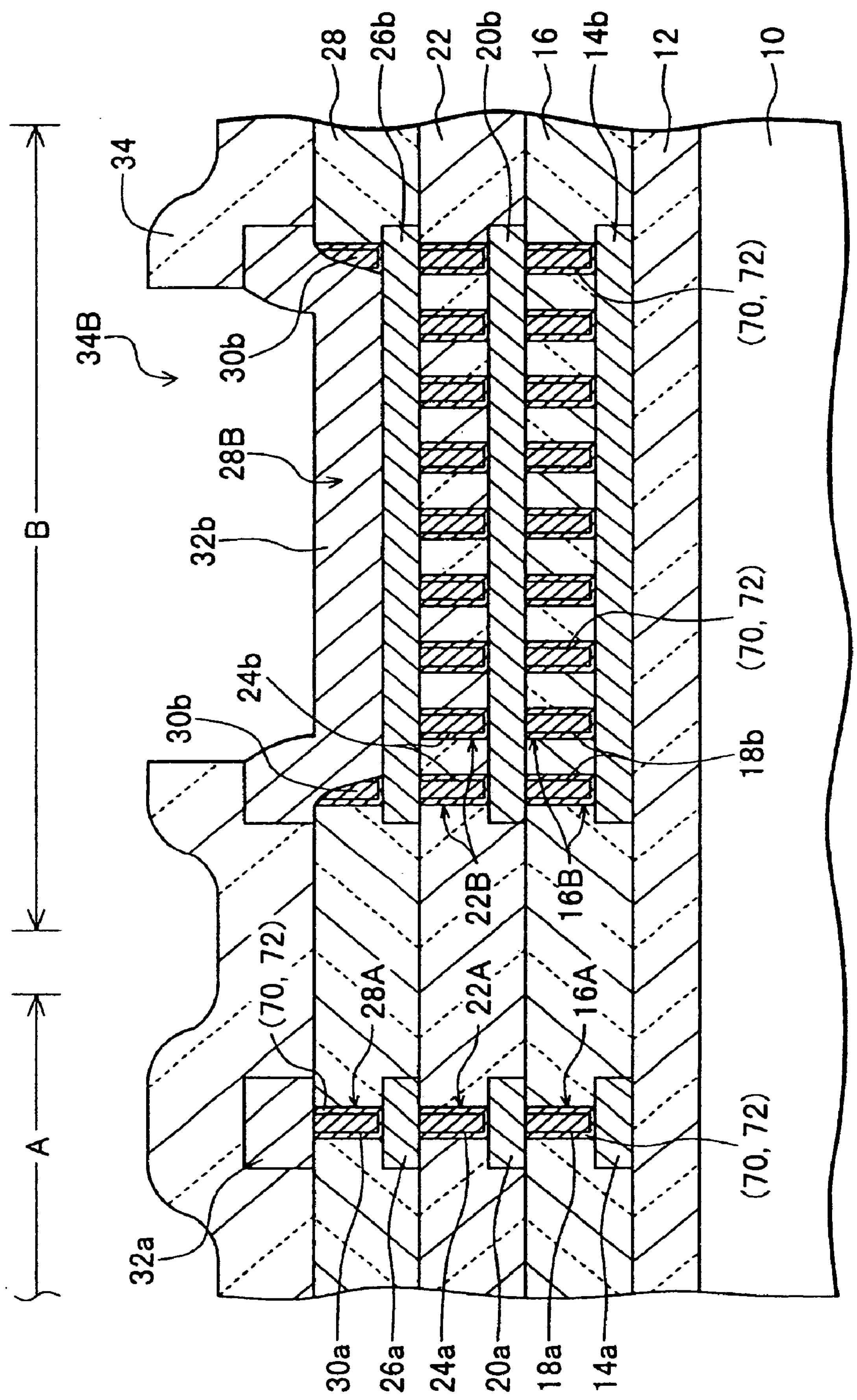
FIG. 1 is a cross sectional view of a semiconductor device according to an embodiment of the invention.
Figure 2:
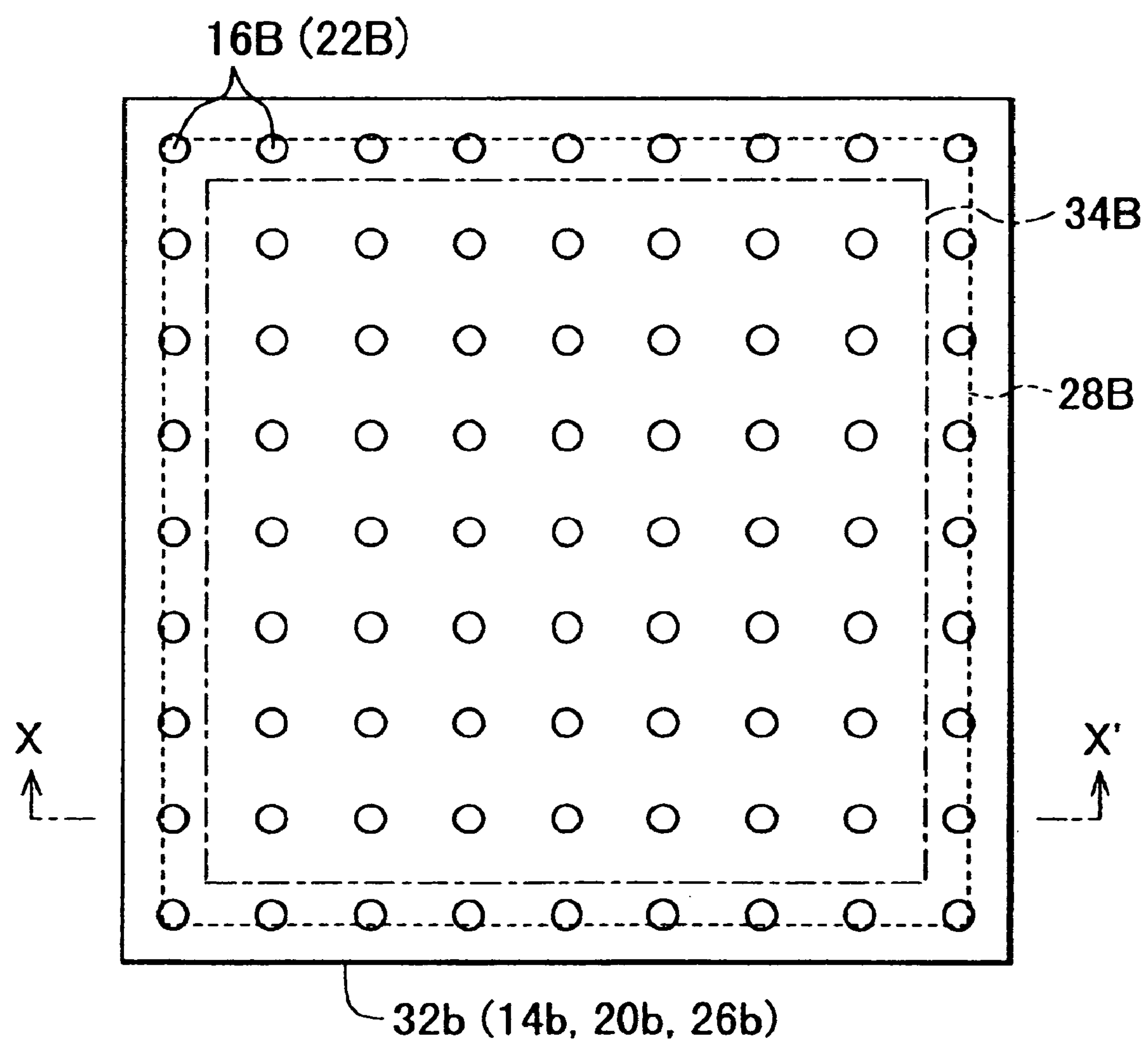
FIG. 2 is a plan view showing a bonding pad area of the semiconductor device shown in FIG. 1.
Figure 3:
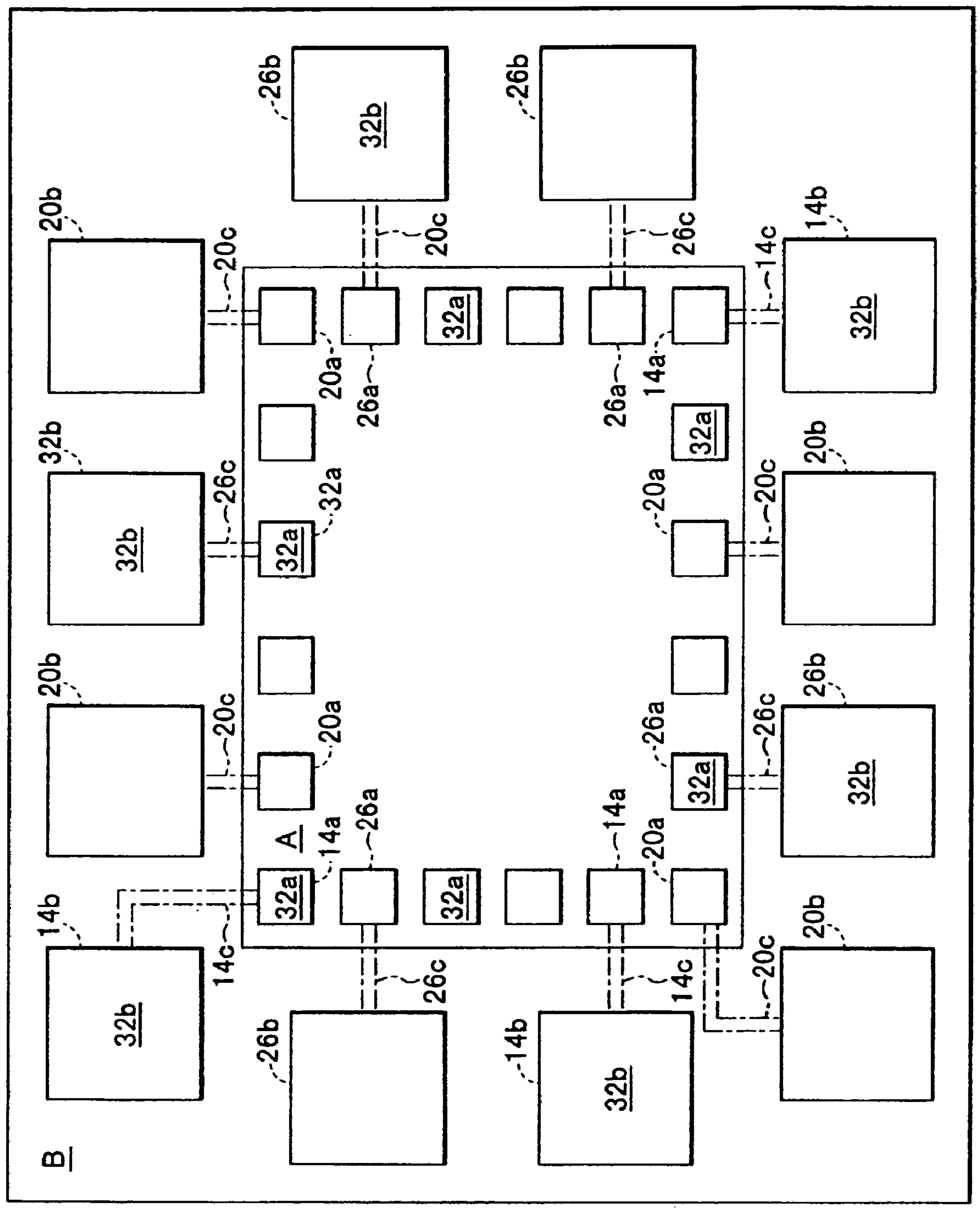
FIG. 3 is a schematic plan view of a semiconductor device, showing a connection example between bonding pads and internal wiring patterns of the semiconductor device shown in FIG. 1.

FIGS. 1 to 6 show a semiconductor device according to an embodiment of the invention. FIG. 1 is a cross sectional view taken along line X–X' of the plan view shown in FIG. 2. FIG. 3 is a schematic diagram showing the overall layout of the semiconductor device. The semiconductor device shown in FIGS. 1 to 6 will be described by taking as an example a four-layer wiring structure.

On an insulating film 12 made of silicon oxide or the like and covering the surface of a semiconductor substrate 10 made of silicon or the like, a first-level (first-layer) wiring layer 14*a* and a first-level pad layer 14*b* are formed. The first-level wiring layer 14*a* is formed in an inner wiring area A including an integrated circuit formed on the semiconductor substrate 10, and the first-level pad layer 14*b* is formed in a bonding pad area B around the area A. A number of bonding pad areas B are disposed surrounding the area A.

Figure 4:
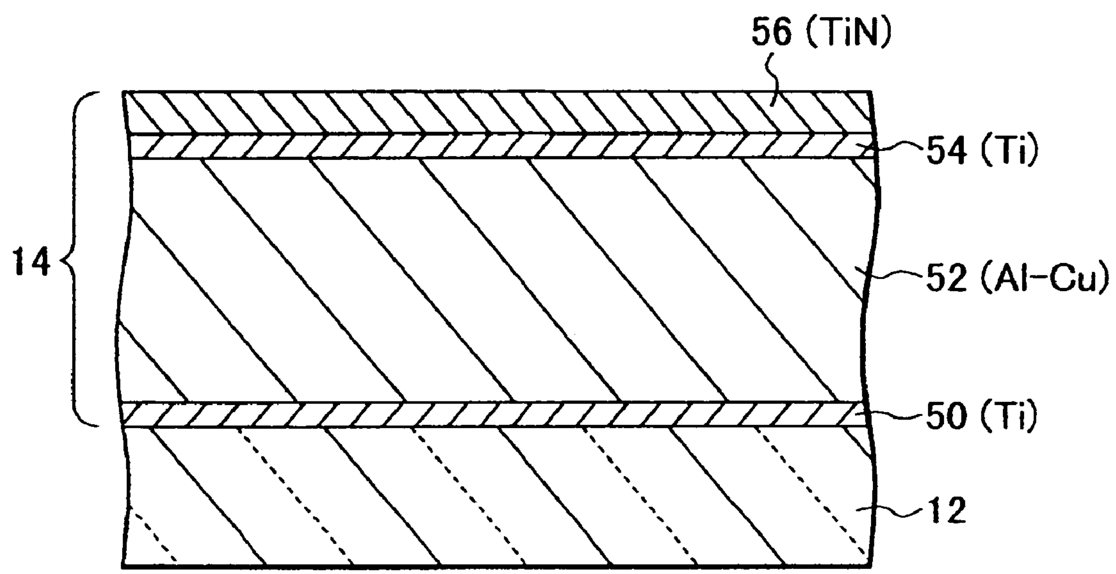
FIG. 4 is a cross sectional view showing a wiring layer of the semiconductor device shown in FIG. 1.
Figure 5:
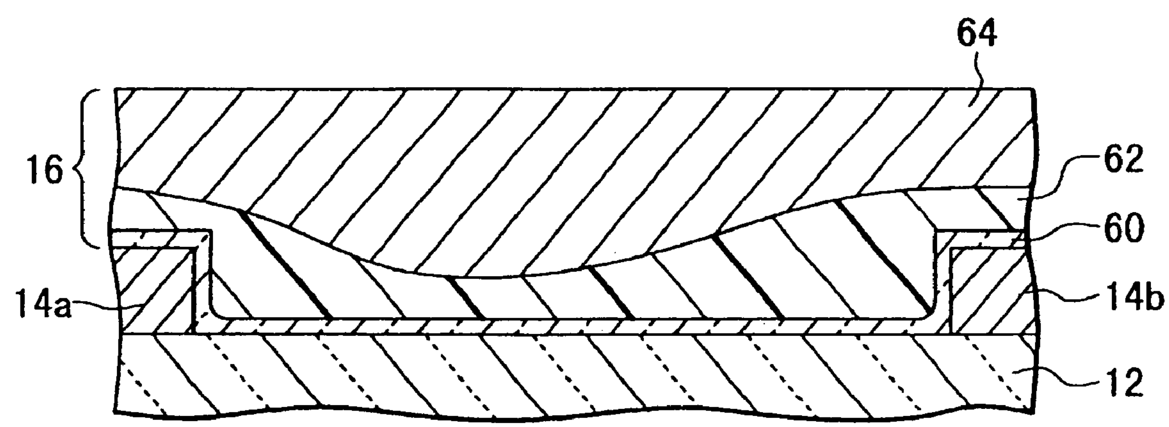
FIG. 5 is a cross sectional view showing an interlayer insulating film of the semiconductor device shown in FIG. 1.

The first-level wiring layer 14*a* and first-level pad layer 14*b* are formed by forming a wiring material layer 14 shown in FIG. 4 on the insulating film 12 and patterning this wiring material layer 14 by photolithography and dry etching. For example, the wiring material layer 14 is formed by depositing through sputtering a Ti layer 50 having a thickness of 15 nm, an Al-0.5 wt % Cu alloy layer 52 having a thickness of 400 nm, a Ti layer (resistance reducing layer) 54 having a thickness of 10 nm and a TiN layer (antireflection layer) 56 having a thickness of 40 nm in this order from the substrate side. The size of the pad layer 14*b* is, for example, 70 μm×70 μm.

On the insulating film 12, a first-level interlayer insulating film 16 is formed covering the first-level wiring layer 14*a* and first-level pad layer 14*b*. The first-level insulating film 16 is formed, for example, by the process illustrated in FIG. 5. Namely, on the insulating film 12, a silicon oxide film 60 is formed by plasma CVD, covering the first-level wiring layer 14*a* and first-level pad layer 14*b*. Next, hydrogen silsesquioxane resin is coated on the silicon oxide film 60 by spin coating. This coated film is subjected to heat treatment to form a ceramic silicon oxide film 62 having a thickness of about 400 nm in a flat area. In place of hydrogen silsesquioxane, other organic or inorganic SOG may also be used. Thereafter, a silicon oxide film 64 having a thickness of 120 nm is formed by plasma CVD, covering the silicon oxide film 62.

The upper surface of the insulating film 16 is planarized by CMP. For example, the silicon oxide film 64 is subjected to CMP to reduce the thickness of the insulating film 16 to a thickness of 800 nm above the first-level wiring layer 14*a*. A step left in the IC (integrated circuit) chip area is reduced to about 100 nm. An area of an IC chip obtained by slicing the semiconductor substrate 10 in the unit of each integrated circuit is called the IC chip area. In the example shown in FIG. 1, this IC chip area includes the inner wiring area A and a number of bonding pad areas B disposed around the area A. Etching may be performed to planarize the first-level interlayer insulating film 16.

Reverting to FIG. 1, a contact hole 16A corresponding to the wiring layer 14*a* and a number of contact holes (e.g., 81 contact holes) corresponding to the pad layer 14*b* are formed through the first-level insulating film 16 by photolithography and dry etching. For example, if the diameter of the smallest contact hole in the area A is 0.35 μm, the diameter of each contact hole 16B is set to 0.35 μm. A number of contact holes 16B are disposed on the pad layer 14*b* in a matrix pattern as shown in FIG. 2. A distance between adjacent contact holes 16B is set to a desired value longer than the minimum space determined by the design rule, for example, to 0.65 μm. It is preferable to set the diameter of each contact hole 16B to 2D or smaller where D is the diameter of the smallest contact hole in the internal wiring area A.

Contact plugs 18*a* and 18*b* made of conductive material such as W are buried in the contact holes 16A and 16B. The contact plug 18*a* has the structure such as shown in FIG. 6.

The contact plug 18_b_ is formed by a process similar to that of forming the contact plug 18_a_.

Figure 6:
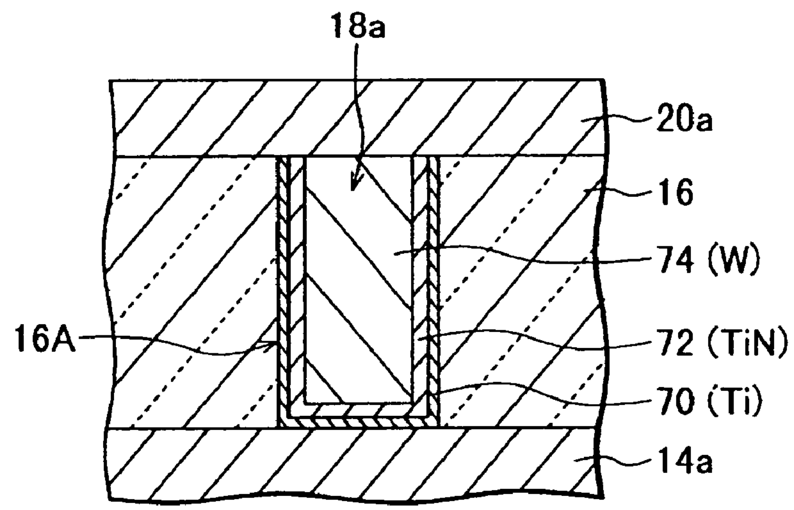
FIG. 6 is a cross sectional view showing an interlayer connection portion of the semiconductor device shown in FIG. 1.

In the structure shown in FIG. 6, on the insulating film 16, a Ti layer 70 having a thickness of 15 nm and a TiN layer 72 having a thickness of 100 nm are sequentially sputtered covering the inner wall of the contact hole 16A. A lamination of the Ti layer 70 and TiN layer 72 functions as a tight contact layer with a W layer 74 to be deposited thereafter. On the TiN layer 72, a W layer 74 having a thickness of 500 nm is formed by blanket CVD, burying the contact hole 16A. Thereafter, a lamination of the Ti layer 70, TiN layer 72 and W layer 74 is etched back until the upper surface of the insulating film 16 is exposed. In this manner, the contact plug 18_a_ made of the Ti layer 70, TiN layer 72 and W layer 74 is left in the contact hole 16A. The etch-back may be performed by leaving a lamination of the Ti layer 70 and TiN layer 72 on the upper surface of the insulating film 16. After the inner wall of the contact hole is covered with the tight contact layer of the Ti and TiN lamination, the W plug is formed. Therefore, an adhesive force between the contact plug and insulating film can be made strong. Since a number of contact plugs including the tight contact layer are formed, peel-off and cracks of the coated insulating film can be suppressed effectively.

Similar to the wiring layer 14_a_ and pad layer 14_b_, on the insulating film 16, a second-level wiring layer 20_a_ and a second-level pad layer 20_b_ are formed. The wiring layer 20_a_ is connected via the contact plug 18_a_ to the wiring layer 14_a_, and the pad layer 20_b_ is connected via a number of contact plugs 18_b_ to the pad layer 14_b_. The size of the pad layer 20_b_ may be the same as that of the pad layer 14_b_, i.e., 70 μm×70 μm.

The wiring layer 20_a_ is connected to the Ti layer 70, TiN layer 72 and W layer 74 of the contact plug 18_a_ in the opening of the contact hole 16A shown in FIG. 6. This contact state is also applied to a connection between the pad layer 20_b_ and each contact plug 18_b_.

On the insulating film 16, a second-level interlayer insulating film 22 is formed covering the wiring layer 20_a_ and pad layer 20_b_. The second-level interlayer insulating film 22 is formed by a process similar to that of forming the first-level interlayer insulating film 16 described with reference to FIG. 4. The second-level interlayer insulating film 22 also includes a coated insulating film like the silicon oxide film 62. The upper surface of the insulating film 22 is planarized by CMP or the like, similar to the first-level interlayer insulating film 16.

A small diameter second-level contact hole 22A corresponding to the second-level wiring layer 20_a_ and a number of small diameter second-level contact holes (e.g., 81 contact holes) corresponding to the second-pad layer 20_b_ are formed through the second-level insulating film 22 by photolithography and dry etching. Second-level contact plugs 24_a_ and 24_b_ made of conductive material such as W are buried in the small diameter second-level contact holes 22A and 22B. The second-level contact plugs 24_a_ and 24_b_ are formed by a method similar to that described with FIG. 5 and has the same structure as that of the contact plug 18_a_ shown in FIG. 5.

Similar to the first-level wiring layer 14_a_ and first-level pad layer 14_b_, on the second-level insulating film 22, a third-level wiring layer 26_a_ and a third-level pad layer 26_b_ are formed. The third-level wiring layer 26_a_ is connected via the contact plug 24_a_ to the second-level wiring layer 20_a_, and the third-level pad layer 26_b_ is connected via a number of second level contact plugs 24_b_ to the second-level pad layer 20_b_. The size of the third-level (highest level) pad layer 26_b_ may be the same as that of the second-level pad layer 20_b_, i.e., 70 μm×70 μm. The contact state between the third-level (highest level) wiring layer 26_a_ and second-level contact plug 24_a_ and the contact state between the third-level (highest level) pad layer 26_b_ and each second-level contact plug 24_b_ are the same as that between the second-level wiring layer 20_a_ and first-level contact plug 18_a_ shown in FIG. 5.

On the second-level interlayer insulating film 22, a third-level (highest level) interlayer insulating film 28 is formed covering the third-level wiring layer 26_a_ and third-level pad layer 26_b_. The third-level (highest level) insulating film 28 is formed by a process similar to that of forming the first-level insulating film 16 described with reference to FIG. 5, and includes a coated insulating film like the silicon oxide film 62. Instead of the coated insulating film like the silicon oxide film 62, the third-level (highest level) insulating film 28 may be made of other films such as a single layer made of a silicon oxide film formed by high density plasma CVD. The upper surface of the insulating film 28 is planarized by CMP or the like similar to the first-level insulating film 16.

A relatively small diameter third-level contact hole 28A corresponding to the third-level wiring layer 26_a_ and a relatively large diameter third-level contact hole 28_b_ corresponding to the third-level pad layer 26_b_ are formed through the third-level insulating film 28 by photolithography and dry etching. If the diameter of the smallest contact hole in the inner wiring area A is 0.35 μm, the size of the large diameter third-level contact hole 28B may be 65 μm×65 μm.

In the dry etching process of forming the small diameter third-level contact hole 28A and large diameter third-level contact hole 28B, the etching conditions such as an etching time are set so that the TiN layer and Ti layer (corresponding to those 56 and 54 in FIG. 4) of the third-level pad layer 26_b_ are etched in the third-level contact hole 28B and the Al—Cu alloy layer (corresponding to that 52 in FIG. 4) is exposed. With this process, although the Al—Cu alloy layer of the third-level pad layer 26_b_ can be exposed in the third-level contact hole 28B, the Al—Cu alloy layer of the third-wiring layer 26_a_ in the third-contact hole 28A is also exposed. This exposed Al—Cu alloy layer in the third-contact hole 28A may lower electromigration resistance and form Al hillock.

In order to reliably leave the TiN layer and Ti layer in the small third-level contact hole 28A, another etching method may be used. Specifically, the small diameter third-level contact hole 28A and large diameter third-level contact hole 28B are formed by dry etching under the etching conditions that the TiN and Ti layers of both the third-level wiring layer 26_a_ and third-level pad layer 26_b_ are left. Thereafter, a resist layer is formed by photolithography exposing the bonding pad area B and covering the inner wiring area A. By using this resist layer and third-level (highest level) insulating film 28 as a mask, the TiN and Ti layers of the third-level pad layer 26_b_ in the large diameter third-level contact hole 28B are removed by dry etching to expose the Al—Cu alloy layer and thereafter remove the resist layer. With this method, lowered electromigration and generation of Al hillock can be prevented because the Al—Cu alloy layer of the third-level wiring layer 26_a_ in the third-level contact hole 28A is not exposed. Reference is made to JP-A-7-335690 which is incorporated herein by reference.

A small diameter third level contact plug 30_a_ made of conductive material such as W is buried in the small diameter third-level contact hole 28A. This contact plug 30_a_ is formed by a process similar to that described with reference to FIG. 5 and has the structure similar to that of the first-level contact plug 18_a_ shown in FIG. 5. With the process of etching back the Ti layer, TiN layer and W layer (corresponding to those 70, 72 and 74 shown in FIG. 5) of the third-level plug 30_a_, a lamination of the Ti layer, TiN layer and W layer is left on the side wall of the large diameter third-level contact hole 28B.

A wiring material layer is formed on the insulating film 28, covering the lamination 30*b* and large diameter third-level contact hole 28B. For example, the wiring material layer is formed by depositing through sputtering a Ti layer having a thickness of 15 nm, an Al-0.5 wt % Cu alloy layer having a thickness of 1000 nm and a TiN layer (antireflection layer) having a thickness of 40 nm in this order from the substrate side. The deposited wiring material layer is patterned by photolithography and dry etching to form a fourth-level wiring layer 32*a* and a fourth-level pad layer 32*b*. In this case, the Ti layer having a thickness of 15 nm under the Al—Cu alloy layer may be omitted. The size of the pad layer 32*b* may be 70 μm×70 μm same as that of the pad layer 26*b*. The wiring layer 32*a* is connected via the contact plug 30*a* to the wiring layer 26*a*, and the pad layer 32*b* is directly connected to the lamination 30*b* and pad layer 26*b* in the large diameter third-level contact hole 28B. If the Ti layer having a thickness of 15 nm is omitted, Al—Cu alloy layers of the pad layers 26*b* and 32*b* become in direct contact with each other. Since the lamination 30*b* of the Ti, TiN and W layers is left on the side wall of the large diameter third-level contact hole 28B while the pad layer 28B is formed, it is possible to prevent the disconnection of the pad layer 32*b* at the upper peripheral edge of the large diameter third-level contact hole 28B.

A passivation film 34 is formed on the insulating film 28, covering the wiring layer 32*a* and pad layer 32*b*. For example, the passivation film 34 is formed by depositing a silicon oxide film having a thickness of 150 nm and a silicon nitride film having a thickness of 1000 nm by plasma CVD in this order from the substrate side.

A contact hole 34B corresponding to the pad layer 32*b* is formed through the passivation film 34 by photolithography and dry etching. The contact hole 34B allows a wire to be bonded to the pad layer 32*b*, and has a size of, for example, 60 μm×60 μm.

Figure 7:
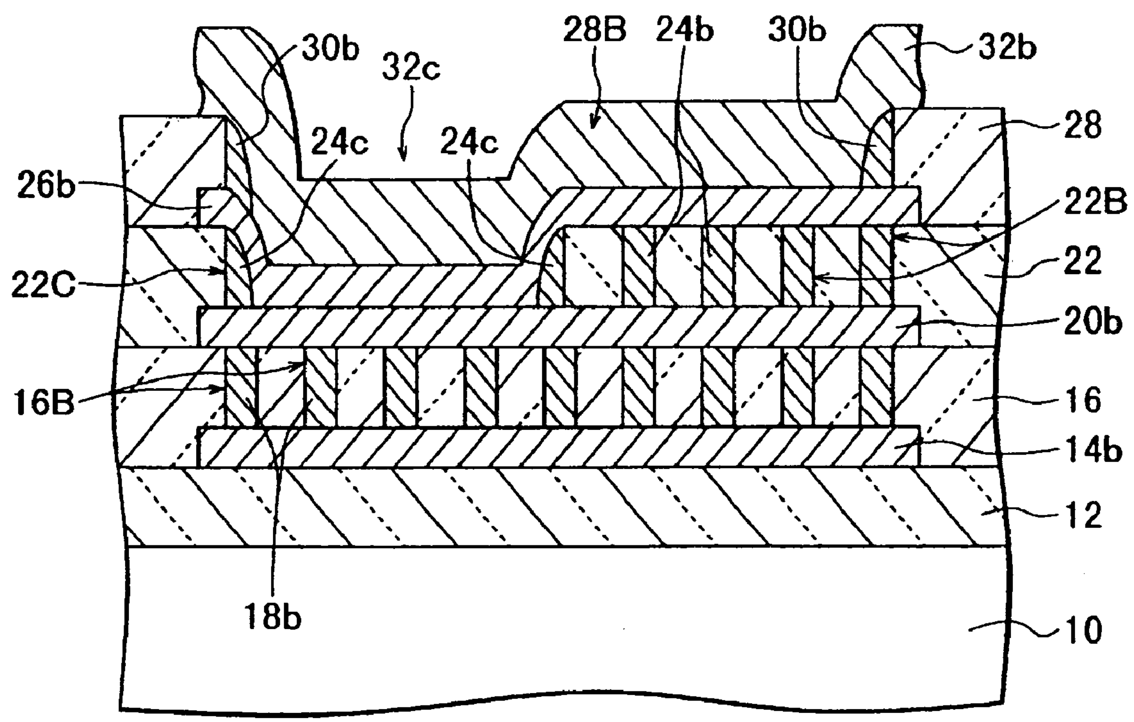
Figure 8:
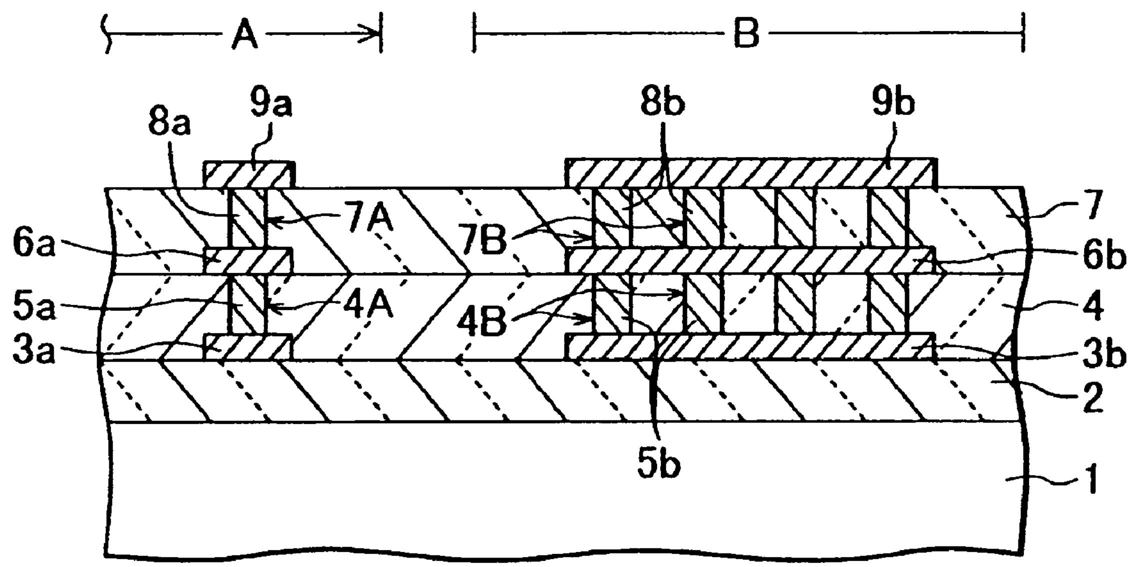
FIG. 8 is a cross sectional view showing an example of a conventional semiconductor device.
Figure 9:
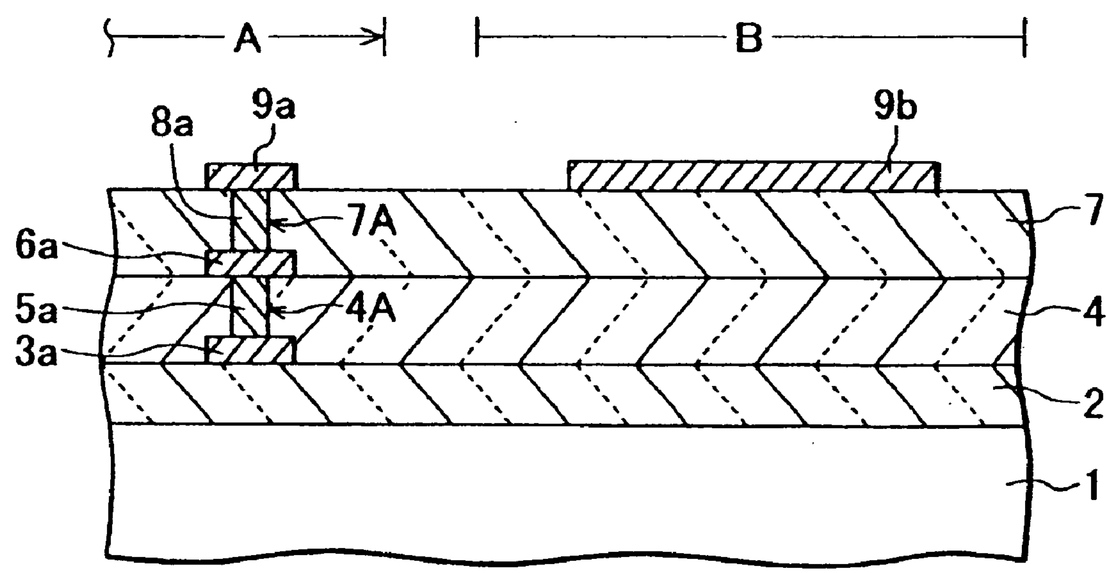
FIG. 9 is a cross sectional view showing another example of a conventional semiconductor device.
Figure 10:
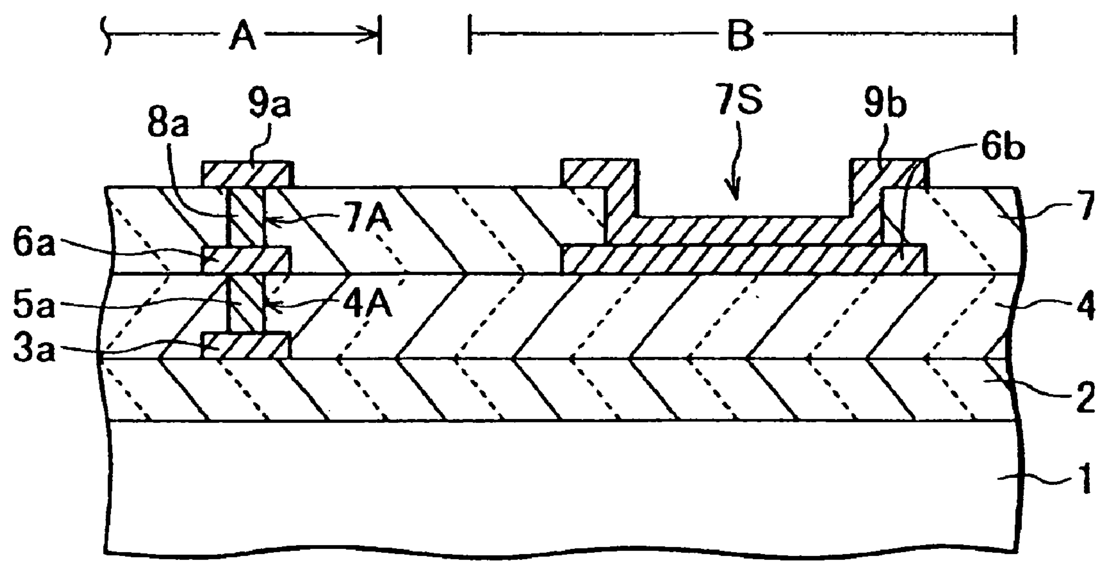
FIG. 10 is a cross sectional view showing still another example of a conventional semiconductor device.
Figure 11:
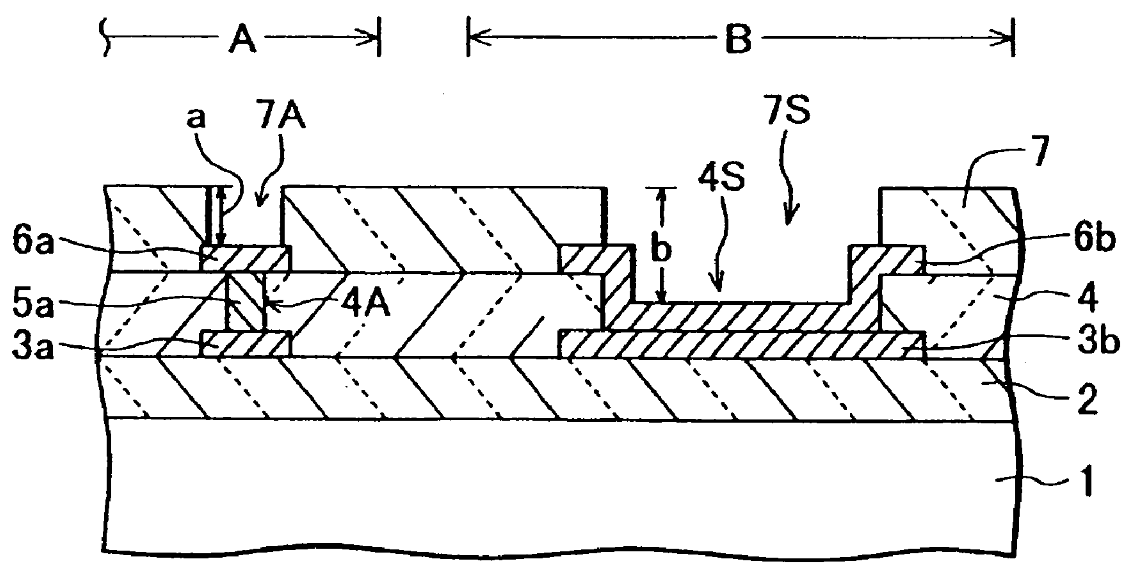
FIG. 11 is a cross sectional view showing still another example of a conventional semiconductor device.

FIG. 7 shows another bonding pad area of a semiconductor device. In FIG. 7, like elements to those shown in FIG. 1 are represented by identical reference symbols, and the detailed description thereof is omitted. In this example shown in FIG. 7, the processes up to the process of planarizing the upper surface of the interlayer insulating film 22 are similar to those described with reference to FIG. 1.

A plurality of relatively small diameter second-level contact holes 22B and a relatively large size contact hole 22C are formed through the insulating film 22 by photolithography and dry etching. Each relatively small diameter second-level contact hole 22B has a diameter of 2D or smaller where D is the diameter of the smallest contact hole in the inner wiring area A described earlier. The contact hole 22C has a diameter larger than 2D.

By a process similar to the process described with reference to FIG. 6, a plurality of contact plugs are formed in the contact holes 28B. In this case, a lamination 24*c* similar to the lamination 30*b* is left on the side wall of the contact hole 22C. Generally, in the process of depositing and etching back a wiring material layer such as W, the deposition thickness and etch-back amount of W are determined so that W is sufficiently filled in the contact hole having the diameter D. Under these conditions, if the diameter of the contact hole 22C is larger than 2D, it is difficult to sufficiently bury W in the contact hole 22C. During the etch-back process, the lamination 24*c* is left on the side wall of the contact hole 22*c* and the upper surface of the pad layer 26*b* in the contact hole 22C is exposed.

A third-level pad layer 26*b* is formed by depositing a wiring material layer such as the layer 14 shown in FIG. 4 on the insulating film 22 so as to cover the contact plug 24*b*, lamination 24*c* and contact hole 22*c* and by pattering the wiring material layer. The pad layer 26*b* directly contacts the lamination 24 and pad layer 20*b* in the contact hole 22C, and is connected to the pad layer 20*b* via the contact plug 24*b* in the area other than the contact hole 22C.

By a process similar to that described with FIG. 1, an interlayer insulating film 28 is formed on the insulating film 22, covering the pad layer 26*b*. By a process similar to that described with FIG. 1, a contact hole 28B corresponding to the pad layer 26*b* is formed through the insulating film 28. By a process similar to that described with FIG. 1, a contact plug (corresponding to that 30*a* in FIG. 1) is buried in the contact hole (corresponding to that 28A in FIG. 1), and a lamination 30*b* is left on the side wall of the contact hole 28B. Thereafter, by a process similar to that described with FIG. 1, a wiring material layer is deposited on the insulating film 28 and patterned to form a pad layer 32*b*. The pad layer 32*b* is directly connected to the lamination 30*b* and pad layer 26*b* in the contact hole 28B.

In the bonding pad structure shown in FIG. 7, the pad layer 32*b* has a recess 32*c* corresponding to the contact hole 22C.

In the bonding pad area B shown in FIG. 1, the small diameter first- and second-level contact holes 16B and 22B in the first- and second-level interlayer insulating films 16 and 22 are set to have a diameter of 2D or smaller in order that the contact holes 16B and 22B can be buried sufficiently with W or the like when a contact hole having a diameter D is buried with W. Therefore, as shown in FIG. 1, a flat pad layer 32*b* without a recess such as the recess 32*c* can be formed in the contact hole 28B. That a contact hole having a diameter of 2D or smaller can be buried sufficiently with W or the like when a contact hole having a diameter of D is buried with W, is already known (for example, refer to JP-A-9-219451).

FIG. 3 shows an example of a connection between wiring layers 14*a*, 20*a*, 26*a* and pad layers 14*b*, 20*b*, 26*b* of the semiconductor device shown in FIG. 1.

The wiring layers 14*a*, 20*a*, 26*a* and pad layers 14*b*, 20*b*, 26*b* are connected together at predetermined levels, e.g., on an insulation film 12, on a first-level interlayer insulating film 76, and on a second-level interlayer insulating film 22, respectively.

On the insulating film 12, the wiring layer 14*a* is connected to the pad layer 14*b* via a wiring pattern 14*c*.

On the first-level interlayer insulating film 16, the wiring layer 20*a* is connected to the pad layer 20*b* via a wiring pattern 20*c*.

On the second-level interlayer insulating film 22, the wiring layer 26*a* is connected to the pad layer 26*b* via a wiring pattern 26*c*.

One wiring layer may be connected to one bonding pad 32*b* or two or more wiring layers may be connected if necessary to one bonding pad 32*b*.

In the embodiment shown in FIG. 1, when a wire is bonded to the pad layer 32*b*, a bonding stress applied to the second-level interlayer insulating film 22 is distributed to a number of second-level contact plugs 24*b* and a bonding stress applied to the first-level interlayer insulating film 16 is distributed to a number of first-level contact plugs 18*b*. It is therefore possible to suppress peel-off and cracks of the coated insulating film including both the first- and second-level interlayer insulating films 16 and 22.

Since a wire is bonded to the bonding pad layer 32*b* in direct contact with the third-level pad layer 26*b*, a sufficient bonding pad strength can be realized easily. For example, as described earlier, even if an Au wire is bonded to the bonding pad layer 32*b* having the bonding pad structure that the third-level pad layer 26*b* and bonding pad layer 32*b* both are made of Al alloy and in direct contact with each other, a lowered shearing stress was not found by a shear test after the bonding pad layer was exposed to a high temperature.

The reason for this may be ascribed to a sufficient supply of Al from the third-level pad layer 26*b* and bonding pad layer 32*b* to the bonding portion.

Furthermore, the depths of the contact holes including the small diameter first-, second- and third-level contact holes 16A and 16B, 22*a* and 22*b*, and 28A and 28B are substantially the same. It is therefore possible to prevent the size of a contact hole in the inner wiring area A from being increased by an over-etch during the contact hole etching.

The present invention has been described in connection with the preferred embodiments. The invention is not limited only to the above embodiments. For example, the invention is applicable not only to the four-layer wiring structure but also to a three-layer wiring structure, a five-layer wiring structure and the like. Wiring material may be Al in place of Al alloy. It is not necessary that all the pad layers from the lowest to highest levels have a lamination structure of a pad layer and a contact plug. For example, it is obvious that the lamination structure may be applied to the pad layers from the second-level to the highest level. It is apparent that various modifications, improvements, combinations, and the like can be made by those skilled in the art.

What is claimed is:

1. A semiconductor device comprising:

a semiconductor substrate; and a bonding pad portion formed on said semiconductor substrate; said bonding pad portion comprising:

an insulating film formed on said semiconductor substrate;

a first-level conductive pad layer of a large island shape formed on said insulating film;

first-level to (n−1)-level (n is an integer of 3 or larger) interlayer insulating films formed on and over said insulating film;

second-level to n-level conductive pad layers formed on said interlayer insulating films in areas generally corresponding to an area where said first conductive pad layer was formed;

a plurality of small diameter first through holes from the first-level to (n−1) level formed through said first-level to (n−1) level interlayer insulating films;

a plurality of first conductive plugs filled in said small diameter first through holes from the first-level to (n−1)-level, said first conductive plugs at each level being conductive and electrically connecting two conductive pad layers adjacent along a normal to a surface of said semiconductor substrate, among said first-level to n-level conductive pad layers disposed on said insulating film, and first-level to (n−1)-level interlayer insulating films;

an n-level interlayer insulating film formed on said (n−1)-level interlayer insulating film and covering said n-level conductive pad layer;

a large diameter through hole formed through said n-level interlayer insulating film to expose an area of said n-level conductive pad layer; and a bonding pad formed on said n-level interlayer insulating film and n-level conductive pad layer via said large diameter through hole, wherein said small diameter first through holes include ones located in a peripheral area outside of said large diameter through hole.

2. The semiconductor device according to claim 1, wherein said small diameter first through holes are substantially uniformly distributed in an area defined by said large diameter through hole and said peripheral area.

3. The semiconductor device according to claim 1, wherein said small diameter first through holes are substantially uniformly distributed in a direction normal to a surface of said semiconductor substrate.

4. The semiconductor device according to claim 1, further comprising a wiring portion comprising:

the insulating film formed on the semiconductor substrate;

the first-level to (n−1)-level interlayer insulating films formed on the insulating film;

first-level to n-level wiring layers formed on and over said semiconductor substrate at same levels as said first-level to n-level conductive pad layers;

small diameter second through holes from the first-level to (n−1)-level, formed through said first-level to (n−1)-level interlayer insulating films; and a plurality of second conductive plugs filled in said small diameter second through holes from the first-level to (n−1)-level, said second conductive plug at each level being conductive and electrically connecting two wiring layers adjacent along a normal to the surface of said semiconductor substrate, among said first-level to n-level wiring layers disposed on said insulating film, and first-level to (n−1)-level interlayer insulating films.

5. The semiconductor device according to claim 4, further comprising wiring patterns for connecting said bonding pad layer and said wiring layer at a same-level.

6. The semiconductor device according to claim 5, wherein said interlayer insulating film includes a coated insulating film.

7. The semiconductor device according to claim 6, wherein said bonding pad portion is formed around said wiring portion.

8. The semiconductor device according to claim 6, wherein said conductive pad layer includes a Ti layer, an Al—Cu alloy layer and a TiN layer.

9. The semiconductor device according to claim 6, wherein said conductive pad layer includes an Al—Cu alloy layer and a TiN layer.

10. The semiconductor device according to claim 6, wherein a diameter of said small diameter first through hole is two times or smaller than a diameter of said small diameter second through hole.

11. The semiconductor device according to claim 6, wherein said first and second conductive plugs are made of W.

12. The semiconductor device according to claim 6, wherein said first and second conductive plugs each comprise:

a first layer of Ti, Ti/TiN or TiN covering an inner surface of each of said small diameter first and second through holes; and W layer formed thereon.

13. The semiconductor device according to claim 6, wherein said interlayer insulating film contains silicon oxide.

14. The semiconductor device according to claim 6, wherein a silicon oxide film and a silicon nitride film are formed on said n-level interlayer insulating film.

* * * * *